United States Patent [19]

Drexhage

[11] 4,345,011

[45] Aug. 17, 1982

[54] COLOR IMAGING DEVICES AND COLOR FILTER ARRAYS USING PHOTO-BLEACHABLE DYES

[75] Inventor: Karl H. Drexhage, Rochester, N.Y.

[73] Assignee: Eastman Kodak Company, Rochester, N.Y.

[21] Appl. No.: 186,105

[22] Filed: Sep. 11, 1980

Related U.S. Application Data

[62] Division of Ser. No. 873,441, Jan. 30, 1978, Pat. No. 4,247,799.

[51] Int. Cl.³ .............................................. G03F 5/00
[52] U.S. Cl. .......................................... 430/7; 430/5; 430/333; 430/337; 430/339; 430/332
[58] Field of Search ....................... 430/339, 5, 337, 7, 430/333, 332

[56] References Cited

U.S. PATENT DOCUMENTS

| | | |
|---|---|---|
| 1,477,880 | 12/1923 | Kitsee . |
| 1,880,572 | 10/1932 | Wendt et al. ....................... 430/339 |
| 2,030,163 | 2/1936 | Baker . |
| 2,145,960 | 2/1939 | Wheatley et al. ................... 430/339 |
| 3,104,973 | 9/1963 | Sprague et al. .................... 430/339 |
| 3,300,314 | 1/1967 | Rauner et al. . |
| 3,671,251 | 6/1972 | Houle et al. . |
| 3,709,693 | 1/1973 | Bloom et al. . |
| 3,884,695 | 5/1975 | Gallaro et al. . |
| 3,971,065 | 7/1976 | Bayer . |
| 4,019,905 | 4/1977 | Tomita et al. . |
| 4,054,906 | 10/1977 | Yamanaka ............................. 358/44 |
| 4,081,277 | 3/1978 | Brault et al. . |
| 4,204,866 | 5/1980 | Horak et al. . |

FOREIGN PATENT DOCUMENTS

| | | |
|---|---|---|
| 1243744 | 8/1971 | United Kingdom . |
| 1370058 | 10/1974 | United Kingdom . |
| 1370059 | 10/1974 | United Kingdom . |
| 1370060 | 10/1974 | United Kingdom . |
| 1386269 | 3/1975 | United Kingdom . |
| 1392502 | 4/1975 | United Kingdom . |
| 1447510 | 8/1976 | United Kingdom . |

*Primary Examiner*—Won H. Louie, Jr.
*Attorney, Agent, or Firm*—James R. Everett

[57] ABSTRACT

Color filter arrays for color imaging devices are disclosed. The arrays are formed in a single layer of a transparent binder containing at least one cationic photo-bleachable dye. The layer has a thickness less than 10 microns, and the dye is present in the layer in an amount sufficient to impart a density to the layer of at least about 0.5 in that portion of the spectrum in which it selectively absorbs. A method of making the arrays is also disclosed which includes the steps of (1) forming a layer of a transparent binder containing the photo-bleachable dye or dyes and a sensitizer; (2) exposing the layer to a pattern which represents a set of filter elements so as to photo-bleach the photo-bleachable dye; and (3) fixing the layer by leaching the sensitizer from the layer. In particularly preferred embodiments, the dyes are chosen so that those which absorb at longer wavelengths have a lower bleaching efficiency than those which absorb at shorter wavelengths.

18 Claims, 2 Drawing Figures

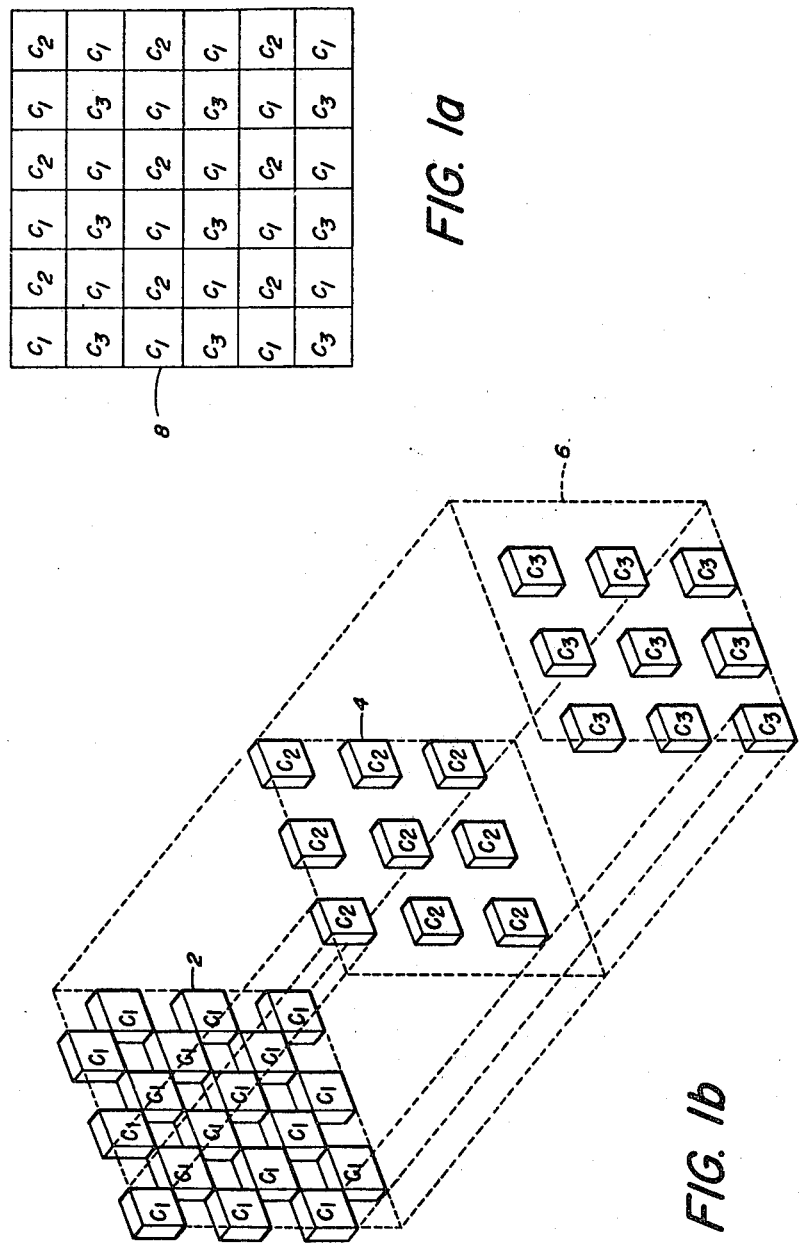

COLOR IMAGING DEVICES AND COLOR FILTER ARRAYS USING PHOTO-BLEACHABLE DYES

This is a division of application Ser. No. 873,441, filed Jan. 30, 1978, U.S. Pat. No. 4,247,799.

BACKGROUND OF THE INVENTION

1. Field of the Invention

This invention relates to color imaging devices. More particularly, it relates to solid-state photosensitive devices that have a planar array of charge-handling semiconductive photosensors in micro-registration with a multicolor planar array of filter elements, and to methods of making them. The color imaging devices of the present invention are particularly useful in solid-state video cameras.

2. Description Relative to the Prior Art

A reliable, yet sensitive, all solid-state video camera would find abundant utility, including use in television cameras, card readers, facsimile recorders, picturephones, character recognition, etc. Solid-state video cameras would be desirable because, in addition to the problems inherent in traditional video cameras of drift, misalignment and short tube life, such traditional, i.e., non-solid-state, video cameras suffer from the complications of registering separate electron beams and the effects of electron beam lag. A relatively simple, efficient solid-state color camera which would overcome these problems is still sought.

Color photosensitive devices using charge-handling solid-state image sensors of various types, for example, charge-coupled devices, known as CCDs, and charge-coupled imagers known as CCIs, have been proposed for and used in video cameras. To avoid optical complexity and problems with image registration, it is highly desirable that color image sensing occur at a single imaging site, e.g., at a single planar photosensitive array. Many problems are encountered with such "single-site" color imaging, however, because at least three distinct types of color information must be extracted in order to represent a color image in video signal form.

Some of the problems associated with "single-site" color imaging processes are overcome by the approach taken in U.S. Pat. No. 3,971,065, issued July 20, 1976, in the name of B. E. Bayer. In the Bayer approach, color imaging is effected by a single imaging array composed of a large number of individual luminance and chrominance sensing elements that are distributed according to type (sensitivity) in repeating interlaid patterns, wherein the luminance pattern exhibits the highest frequency of occurrence—and therefore the highest frequency of image sampling—irrespective of direction across the array.

To produce an element array according to the Bayer approach or other similar approaches, a solid-state sensor array wherein each sensor has a broad wavelength sensitivity is provided with a superposed filter array. Methods for producing multicolor filter arrays for various purposes are known in the art; however, many of these methods are not adaptable for producing color filter arrays which are useful with a solid-state sensor array. For example, multicolor filter arrays that resort to the use of multiple layers are not desirable for single-site color imaging devices, because such arrays require the imaging optics to have a large depth of field so that all layers, as well as the photosensors, are in focus. Further, multilayer arrays can result in misalignment between the individual filter elements and the underlying photosensors.

One method for providing a single layer multicolor filter array is described in commonly assigned copending U.S. Patent Application Ser. No. 730,885, filed Oct. 8, 1976, now abandoned, continuation-in-part application Ser. No. 867,841 filed Jan. 9, 1978 now U.S. Pat. No. 4,204,866. In this application, the color filter array is formed in a dye mordant layer. Dyes are imbibed from a solution into the mordant layer in window patterns using photoresist techniques. Another method for providing a single layer multicolor filter array is described in commonly assigned copending U.S. Application Ser. No. 730,886, also filed Oct. 8, 1976, now U.S. Pat. No. 4,081,277. In the method of this application, heat-transfer dyes are transferred into a dye-receiving layer. Again, photoresist techniques are used to form window areas through which dyes are transferred into the dye-receiving layer. While both of these processes result in filter elements having excellent properties, they both involve repeated application, exposure and removal of photoresist. The use of photoresist can complicate the process of making the filter array and it can result in non-uniform filter elements. For example, non-uniform processing of the photoresist can result in window areas in one part of the array not being as cleanly washed out as window areas in another part of the array. This, in turn, can result in a non-uniform density for the filter elements formed through these windows. It would be highly desirable if these photoresist-related steps could be eliminated.

While it is fairly easy to enumerate the criteria that must be met by a successful color filter array for a color imaging device, it has proven extremely difficult to find an inexpensive process which will result in a color filter array which meets all of these criteria. Thus, while it is known that the color filter array must be formed in a relatively thin layer, that the elements within the array must have excellent edge sharpness, that the density of each individual filter element in the array must be sufficient to adequately control the sensitivity of the underlying photosensor, etc., it is extremely difficult to meet all of these criteria. This is due, in part, because properties meeting some of these criteria are incompatible for meeting others. For example, for a given dye concentration, the thinner the layer the lesser the density. It is difficult, therefore, to get a layer which is, at the same time, thin enough to avoid depth of field problems in the imaging optics and capable of providing sufficient dye density for good color separation in the imaging system. In the past, it has been possible to produce color filter arrays having the desired physical properties, but only by using expensive photoresist techniques. Thus, a color filter array and a method for making it which has all of these properties is still actively sought.

SUMMARY OF THE INVENTION

I have found that a suitably thin color filter array can be made by using cationic photo-bleachable dyes. By using these cationic photo-bleachable dyes, I can provide a thin, i.e., less than 10 micron, layer which, at the same time, can have individual filter elements having a transmission density of at least 0.5. The process of my invention comprises providing the described layer comprising a transparent binder, a cationic photo-bleachable dye and a sensitizer; photographically exposing the layer to a desired pattern to photo-bleach the dye; and fixing by leaching the sensitizer from the layer. Since the dye is initially in the layer, no diffusion of dye into selective areas of the layer is required, thereby eliminating the need for complex photoresist techniques. The method of the present invention produces filter arrays with excellent uniformity. Thus, an advantage of this process of forming a color filter array is that it requires only a few steps (see Example 1) whereas the prior art method of heat transferring dyes typically involves at least 8 steps for one-color and 22 steps for a three-color system as follows:

(1) rinsing the photosensors;
(2) coating a receiving layer;
(3) baking to remove solvents;
(4) coating a photoresist;
(5) exposure through a mask;
(6) development;
(7) heat transfer of dye; and
(8) stripping of photoresist and repeating steps 2 to 8 for the second mask and dye and again repeating the steps for the third mask and dye.

In one preferred embodiment of my invention, a multicolor filter array can be produced having an interlaid pattern of three sets of filter elements. The preferred method comprises simply exposing a layer comprising a transparent binder and three cationic photo-bleachable dyes and a sensitizer to a single pattern representing the three sets of interlaid elements. Again, the layer is fixed by leaching the sensitizer.

In one aspect of the present invention, I provide a color imaging device comprising:
(i) a radiation-sensitive surface and superimposed thereon,
(ii) a layer of a transparent binder containing a planar array of filter elements,
(1) the layer, preferably, being of a thickness less than about 10 microns,
(2) each of the filter elements containing at least one cationic photo-bleachable dye that selectively absorbs radiation in at least one portion of the spectrum and
(3) the dye, preferably, being present in the layer in an amount sufficient to impart a density to the layer of at least about 0.5 in that portion of the spectrum in which it selectively absorbs.

While a variety of radiation-sensitive surfaces are useful in the described device, the preferred surface is a planar array of charge-handling semiconductive photosensors. In this preferred embodiment, the planar array of filter elements is in micro-registration with respect to at least one dimension of the respective photosensors within an array thereof.

In another aspect of the present invention, I provide a method of producing a planar array of filter elements comprising the steps of:
(1) forming a layer, preferably, having a thickness less than 10 microns comprising a transparent binder, a cationic photo-bleachable dye which selectively absorbs radiation in at least one portion of the spectrum, and a sensitizer, the dye preferably being present in the layer in an amount sufficient to impart a density to the layer of about 0.5 in that portion of the spectrum in which it selectively absorbs;
(2) exposing the layer to a pattern representing the filter elements so as to photo-bleach the photo-bleachable dye;
(3) fixing the layer by leaching the sensitizer from the layer.

In layers which contain high concentrations of at least two photo-bleachable dyes, i.e., concentrations required in the filter arrays of the present invention in order to attain the described density, dye-to-dye energy transfer on exposure to imaging radiation can be a problem. When a molecule of a dye of one color is exposed, it has a tendency to transfer some of the exposing energy to a dye of a different color. This is undesirable, since radiation which is intended to bleach one dye can thereby bleach more than one dye, which results in decreased saturation of the desired image. In a particularly preferred embodiment of my invention, I have found that this dye-to-dye energy transfer can be substantially avoided by selecting the dyes such that the dyes which absorb longer wavelengths have a lower bleaching efficiency than those dyes which absorb shorter wavelengths. By selecting the dyes in such a manner, I provide color filter arrays which have all the advantages mentioned above and, in addition, have filter elements with excellent color saturation.

BRIEF DESCRIPTION OF THE DRAWING

FIG. 1A is a pictorial representation of a multicolor filter array according to a preferred embodiment of the invention.

FIG. 1B is an exploded pictorial representation corresponding to the array depicted in FIG. 1A.

DETAILED DESCRIPTION OF THE INVENTION

The color filter arrays of the present invention are formed in a transparent binder layer. In order to form a multicolor filter array, the transparent binder contains a sensitizer and at least two dyes. In order to form a filter element in the layer, an area corresponding to the desired filter element is exposed to radiation the wavelength of which matches the absorption spectrum of one of the dyes. In the presence of the sensitizer, this dye bleaches, whereas the other dye or dyes not absorbing the particular exposing radiation remain unbleached. Thus, the resulting filter element will contain the dye or dyes which were not photo-bleached. Of course, the transparent binder need only contain a single photo-bleachable dye. In such a case, the layer becomes transparent in those areas where exposed. The unexposed areas retain the original density.

In particularly preferred embodiments, the transparent binder contains three dyes. The dyes are chosen such that their combined absorption covers essentially the entire visible spectrum. In one embodiment, the dyes chosen are cyan, magenta and yellow. A multicolor filter array containing three sets of filter elements can be formed in such a layer in the following manner. The layer is exposed to a pattern representing a first set of filter elements. If it is desired that the first set of filter elements transmit red light, red light is used for the exposure. Only the cyan dye in the layer will absorb appreciable amounts of the red light and, in the presence of the sensitizer, will become bleached. Thus, this set of filter elements will transmit red light. Similarly, exposures corresponding to the green- and blue-transmitting filter elements are made to produce a three-color filter array. The exposure can be carried out in three steps through black-and-white positive masks or, in preferred embodiments, in a single step through a three-color mask. After exposure, the color filter array can be fixed by leaching the sensitizer out of the layer.

The transparent binder can be any of a wide variety of materials. By transparent, it is meant that the material has substantially no density in that portion of the spectrum in which the color imaging device is to be sensitive. Typically, the transparent material should have substantially no density to radiation of between about 300 and about 800 nanometers. The transparent binder should be capable of dissolving the cationic photo-bleachable dye in sufficient concentration to provide the required density. Finally, the transparent binder should be permeable to, but not appreciably soluble in, the solvent that is used to leach the sensitizer. In preferred embodiments of the process of the present invention, the sensitizer is leached from the transparent binder layer using water. Thus, preferred transparent binder materials include water-permeable materials, such as binders which are ordinarily used in conventional photographic processes. Such binders include both naturally-occurring substances such as protein, for example, gelatin, gelatin derivatives, cellulose derivatives such as cellulose acetate hydrogenphthalate, polysaccharides, such as dextran, gum arabic and the like; and synthetic polymeric substances such as polyvinyl compounds like poly(vinylpyrolidone), acrylamide polymers and the like. Other synthetic polymeric materials which can be used include dispersed vinyl compounds such as in latex form, including water-insoluble polymers of alkylacrylates and methacrylates, acrylic acid, sulfoalkylacrylates, methacrylates, and those which have crosslinking sites which facilitate hardening or curing. Other useful materials include high molecular weight materials and resins, including poly(vinylbutyral), cellulose acetate butyrate, poly(methylmethacrylate), ethylcellulose, polystyrene, poly(vinylchloride), polyisobutylene, butadiene-styrene copolymers, vinylchloride-vinylacetate copolymers, copolymers of vinylacetate, vinylchloride and maleic acid and poly(vinylalcohol). Combinations of the described binders can also be used. The currently preferred binder is cellulose acetate hydrogenphthalate. The carboxylic acid groups of this binder tend to keep the cationic photo-bleachable dyes in their chromophoric form.

A wide variety of cationic photo-bleachable dyes are known in the art and any of these may be used in the practice of the present invention. Useful photo-bleachable dyes include pyrylium and thiapyrylium photo-bleachable dyes. These dyes are disclosed, for example, in U.S. Pat. Nos. 3,671,251 and 3,300,314.

A particularly preferred class of photo-bleachable dyes include chromylium and thiachromylium dyes, pyrylium and thiapyrylium cyanines, flavylium and thiaflavylium cyanines. These particularly preferred dyes are the invention of K. H. Drexhage and G. A. Reynolds. The cationic portion of useful dyes from these classes are listed below. Where known, the wavelength of maximum absorption is indicated.

Chromylium Dyes

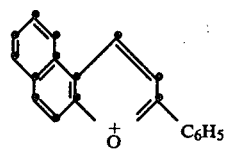

yellow, 450 nm

-continued

Chromylium Dyes

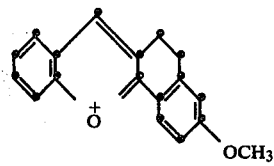

yellow, 455 nm

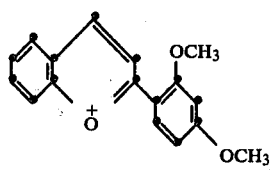

yellow, 465 nm

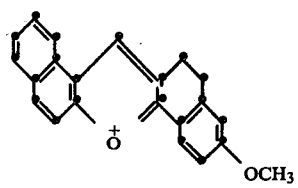

yellow, 490 nm

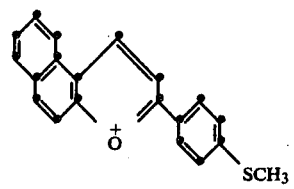

orange, 500 nm

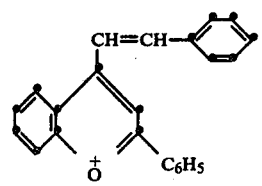

yellow, 465 nm

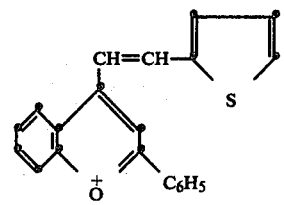

orange

-continued
Chromylium Dyes
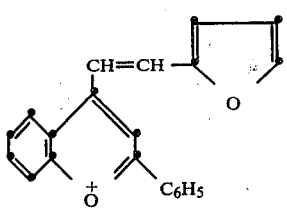
pink
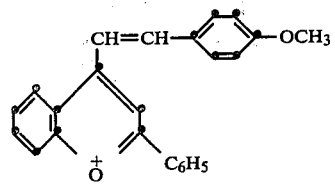
magenta, 530 nm
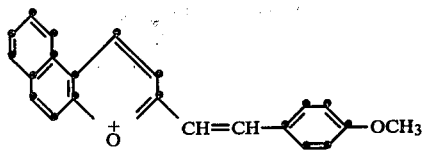
magenta, 530 nm
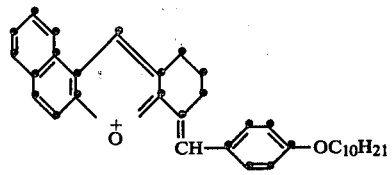
magenta, 550 nm
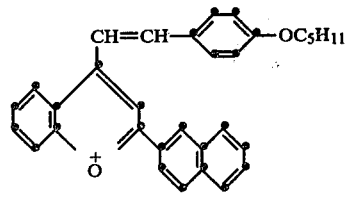
magenta, 545 nm
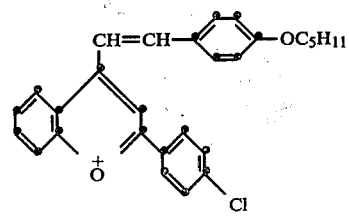
magenta, 540 nm
-continued
Chromylium Dyes
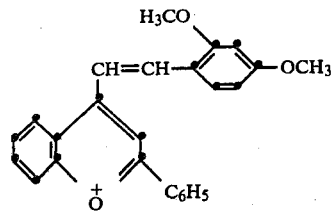
violet, 565 nm
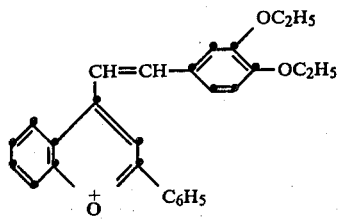
violet, 562 nm
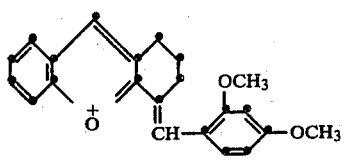
violet, 570 nm
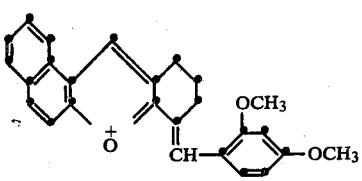
violet, 575 nm
Thiachromylium Dyes
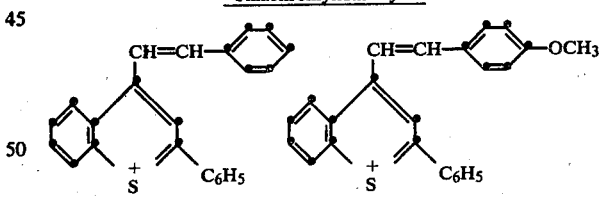
yellow            magenta, 555 nm
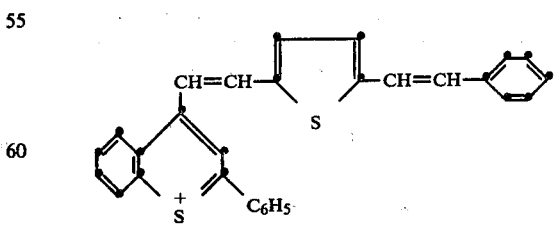
cyan, 662 nm Pyrylium and thiapyrylium cyanine dyes
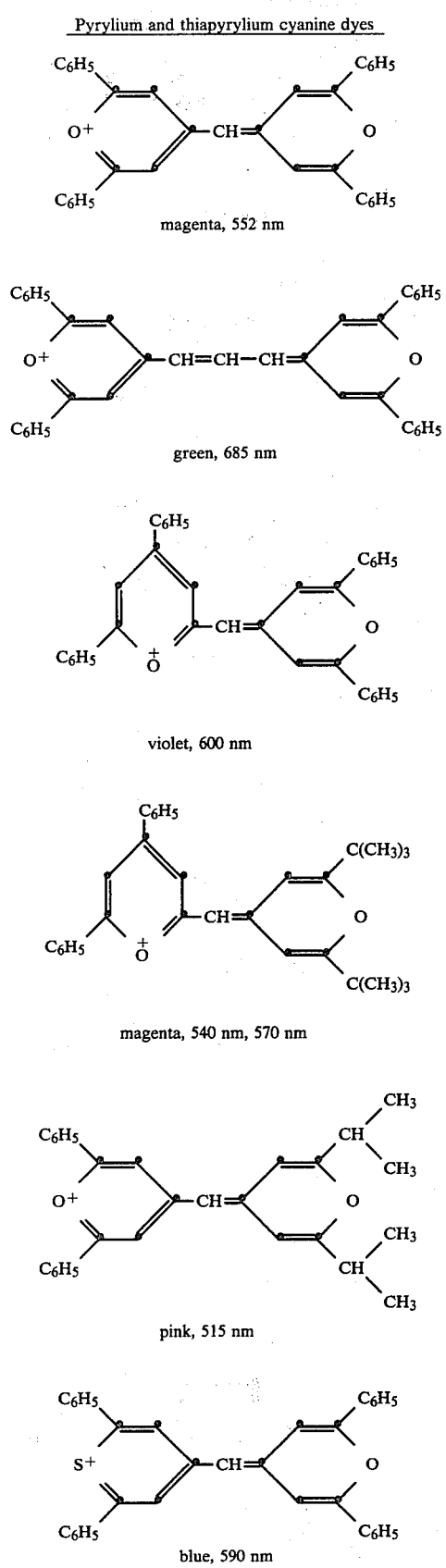
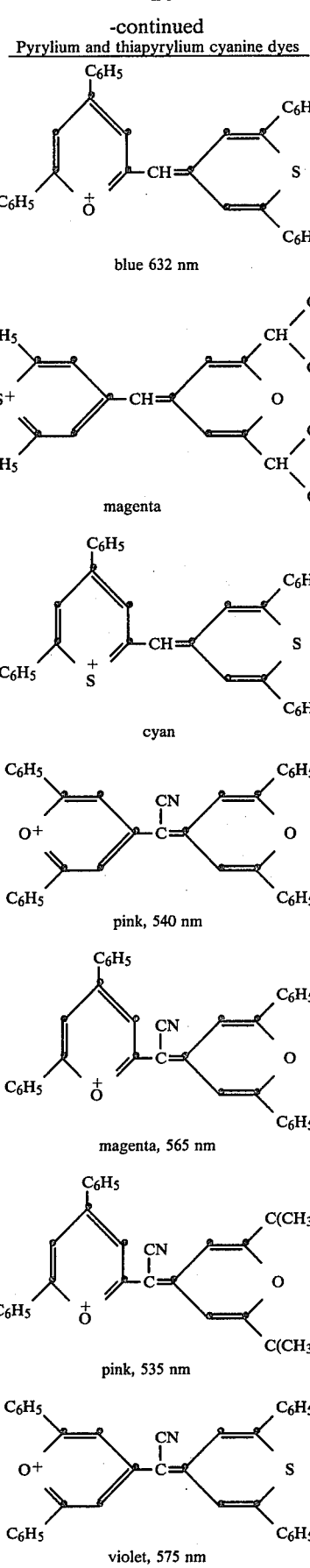

-continued
Pyrylium and thiapyrylium cyanine dyes
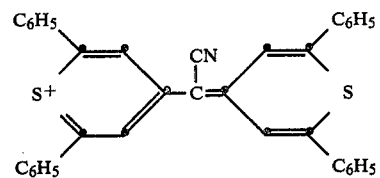
green, 610 nm
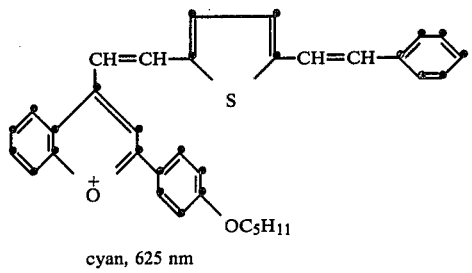
cyan, 625 nm
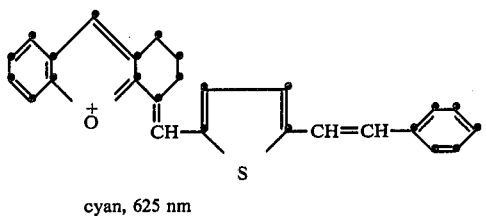
cyan, 625 nm
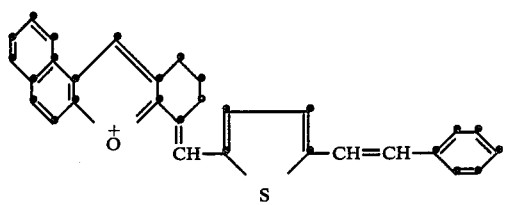
cyan, 630 nm
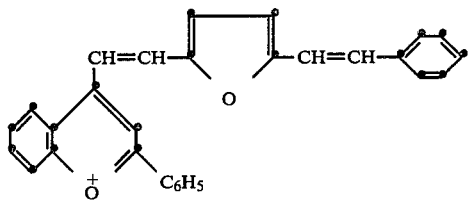
cyan, 650 nm
Flavylium and thiaflavylium cyanine dyes
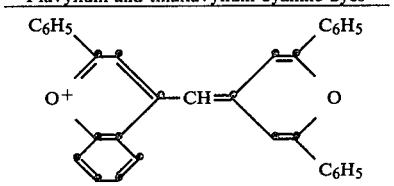
magenta, 568 nm
-continued
Flavylium and thiaflavylium cyanine dyes
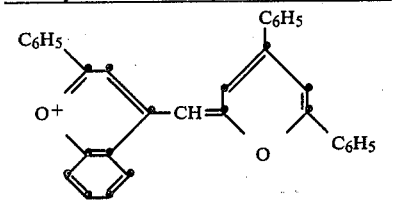
blue, 602 nm
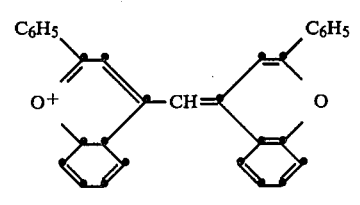
blue, 598 nm
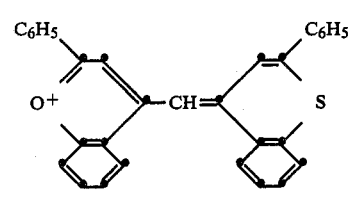
cyan, 645 nm
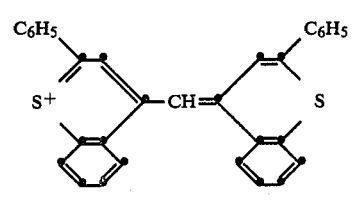
green
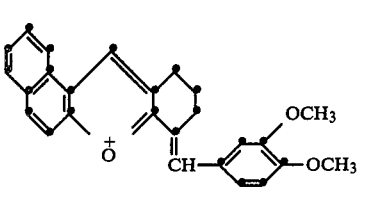
magneta, 555 nm
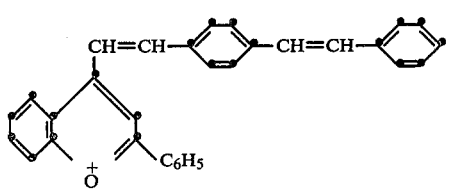
magenta, 552 nm
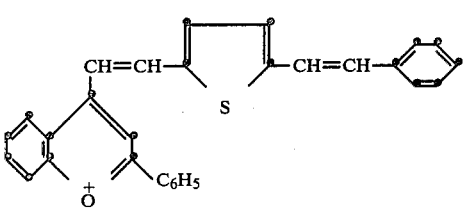
cyan, 635 nm -continued
Flavylium and thiaflavylium cyanine dyes

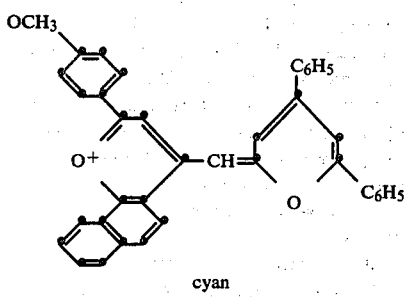

cyan

In certain embodiments of the present invention, the dyes of the color filter array can be selected so as to modulate radiation outside of the visible spectrum. Thus, for certain applications, dyes could be chosen so as to modulate infrared or ultraviolet radiation. However, the color filter arrays of the present invention are most desirably used to modulate imaging radiation in the visible part of the electromagnetic spectrum. By visible part, it is meant the electromagnetic radiation extending from about 400 nanometers to about 700 nanometers. As used herein, "red portion" refers to that portion of the visible electromagnetic spectrum that lies between about 600 and about 700 nanometers. Similarly, "green-portion" refers to radiation between about 500 and about 600 nanometers, and "blue portion" refers to radiation between about 400 and about 500 nanometers.

In certain highly preferred embodiments, where the transparent binder layer contains more than one photo-bleachable dye, the dyes can be chosen so as to substantially reduce the problem of dye-to-dye energy transfer on exposure. This problem of dye-to-dye energy transfer is particularly acute in thin, high density layers because of the high concentration of the dyes. Dyes have a tendency to transfer energy that is incident upon them to contiguous dyes which absorb longer wavelength energy. Thus, a yellow dye will transfer energy to a magenta dye, and both yellow and magenta will transfer energy to a cyan dye in the same layer. By selecting the dyes such that those which absorb longer wavelengths have a lower bleaching efficiency than those which absorb shorter wavelengths, the problems associated with dye-to-dye energy transfer can be substantially eliminated. While not wishing to be limited to any particular theory, it is believed that a high bleaching efficiency dye will photo-bleach before a substantial amount of energy can be transferred. By selecting the dyes as described, filter elements having excellent color saturation can be made. This result is quite unexpected since, according to the prior art, the dyes should be selected to have the same bleaching efficiency (see, for example, U.S. Pat. No. 1,880,572).

Since the cyan can receive energy from both the magenta and yellow dyes in a three-dye layer, the cyan dye should have significantly lower bleaching efficiency than the magenta and yellow. The magenta and yellow can have approximately the same bleaching efficiency. The bleaching efficiency can be determined for an individual dye by coating it and the sensitizer in the desired binder and in the desired concentration. The resulting layer is then irradiated with monochromatic light having a wavelength approximately equal to the maximum absorption wavelength of the dye. The bleaching efficiency is the change in density due to the exposure divided by the number of photons absorbed. Generally, the bleaching efficiency for the magenta and yellow should be about 15 to 30 times greater, preferably about 20 times greater, than the bleaching efficiency for the cyan in order to substantially eliminate dye-to-dye energy transfer.

The sensitizers which are used with the photo-bleachable dyes described herein are well known in the art. As used herein, the term sensitizer refers to a compound that, when combined with a dye, renders the dye sensitive to light so that when the sensitizer-dye combination is exposed, the dye is bleached. Compounds of this type have been known since at least about the turn of the century, when J. H. Smith described this property for allyl-thiourea (Brit. J. Phot. 57 supple 34 and U.S. Pat. No. 1,089,594). The exact mechanism of the action of the sensitizer on the photo-bleachable dye when the photo-bleachable dye is exposed is not completely understood. However, it is believed that the dye itself is the material in the combination which absorbs the exposing radiation, thereby achieving an excited state. It is believed that the sensitizer reacts with the excited dye and bleaches it. Useful sensitizers include compounds that contain a group selected from either thiocarbonyl, mercapto, carbonylperoxide, or thioether. Typical useful compounds include 1-allyl-2-thiourea; S-diethylthiourea; N-allyl-N'-(β-hydroxyethyl)thiourea; mercaptobenzoic acid; 2-hydroxyethylisothiuronium trichloroacetate; diallylthiourea; and 3-allyl-1,1-diethyl-2-thiourea.

The dye should be present in the layer in an amount sufficient to impart a density of about 0.5 to the layer. The density referred to is the transmission density measured by conventional spectrophotometric methods in that portion of the spectrum where the dye has maximum absorption. For example, a cyan dye will have maximum absorption in the red portion of the spectrum, and it is sufficient for the purposes of the present invention that a cyan dye be present in an amount sufficient to impart a density of about 0.5 anywhere in the red portion of the spectrum. As used herein, the measured density is in those areas of the layer where the dye has not been bleached by exposure in the presence of the sensitizer. The exact concentration of dye required to produce the described density will depend on the thickness of the layer, the spectral characteristic of the particular dye chosen and other factors. Generally, a concentration of dye of about 0.02 percent to about 0.1 percent by weight in the coating composition for a layer which is 10 microns thick is sufficient. In preferred embodiments, the density in the layer can be as high as 1.5 with a layer as thin as about 3 microns. Potentially, even higher densities, e.g., 3.0 with thinner layers, e.g., 0.5 microns, are possible. The concentration of dye in the coating composition can be adjusted to achieve these densities. The concentration of dye is, of course, limited by the solubility of the dye in the binder. Preferred cationic photo-bleachable dyes useful in the present invention embody heptafluorobutyrate ($C_3F_7COO^-$) and trifluoroacetate ($CF_3COO^-$) as anions to impart high solubility to the dye. Other particularly useful anions include sulfonates such as toluene sulfonate, 1-butanesulfonate, 1-octanesulfonate and the like.

The concentration of sensitizer in the layer, before fixing, can vary over a wide range. The exact concentration will depend on the particular dye or dyes used, the particular transparent binder used, the rate of bleaching desired, and, of course, the particular sensitizer chosen. Typically, the sensitizer is present in a concentration of about 5 moles per mole of dye. A useful range of concentration of sensitizer is from about 2 to about 6 moles per mole of dye, although in some cases higher and lower concentrations can be used.

Where the radiation-sensitive surface is an array of charge-handling semiconductive photosensors, the color imaging device of the present invention can preferably be made by coating the array of photosensors with the transparent binder containing the photobleachable dye and sensitizer and then forming the color filter array in situ. Alternatively, the color filter array can be made by forming the filter elements in the transparent binder which is coated on a separate transparent support. The separate support is then laminated with the array of photosensors so that the color filter array and the photosensor array are in micro-registration. In this latter embodiment, the support having the color filter array is superimposed on the sensing array with the color filter array closest to the photosensor array and the transparent substrate on the outer side of the resulting sandwich. Any of the well-known transparent supports used in the photographic arts can be used in this embodiment.

In preferred embodiments, the color filter array is in micro-registration with an underlying photosensor array. As used herein, the term micro-registration means that the filter array and the sensing array are precisely aligned, on a micron scale, such that the filter area and underlying sensing area or areas are substantially coextensive with each other. In other words, the position of the filter array is less than one micron away from its intended position with respect to the sensor array. Further, each filter element within the filter array is less than one micron away from its intended position in the array. A single filter element may be superimposed over one sensing area or a group of sensing areas. In some embodiments, the color filter array may be superposed over an array of photosensors whose individual sensing areas are separated by what are known in the art as guard bands. In a typical photosensor array, the sensing areas are generally rectangular in shape and are about 30 by 40 microns. The guard bands are about 4 microns.

The preferred radiation-sensitive surface, over which the described color filter arrays are superimposed, are arrays of solid-state photosensors as described below. Other useful radiation-sensitive surfaces include, for example, a layer of silver halide. Examples of elements and processes using a color filter array over silver halide are described in U.S. Pat. No. 2,030,163; 1,477,880 and 3,709,693. Another useful radiation-sensitive surface is an array of phosphors such as is used in a color cathode ray tube. Examples of color filter arrays superimposed over arrays of phosphors are described in U.S. Pat. No. 3,884,695 and 4,019,905.

The solid-state photosensors useful in the present invention are charge-handling image sensors, examples of which include, for instance, charge-coupled devices (also known as charge-coupled imagers, charge-transfer devices, charge-transfer imagers, etc.), charge-injection devices, bucket brigade devices, diode arrays, combinations of these and the like. Useful photosensor arrays are described, for example, in U.S. Pat. No. 3,801,884 and in "Charge-Coupling Technology Leads to Compact Video Cameras" by A. H. Watson, Bell Laboratories Record, October, 1973, page 266.

An example of a three-color filter array is illustrated in FIGS. 1A and 1B. Three sets of filter elements 2, 4 and 6 form an interlaid pattern to provide the three-color filter array 8. In a preferred color imaging device of the invention, the filter array 8 is superimposed in micro-registration with an array of photosensors (not shown) so that each individual filter element C is superimposed with an individual photosensor. As a result of this arrangement, an image can be sampled for all three color vectors by selecting appropriated dyes for use with the three sets of filter elements 2, 4 and 6 of the filter array 8.

As illustrated, the filter array comprises an interlaid pattern of filter elements. The illustrated elements are rectangular in shape, so as to conform to a common solid-state photosensor array. However, the invention is not limited to use with elements having a rectangular shape. Any element shape can be conveniently used, such as stripes, circular or triangular elements and the like, since the shape is solely a function of the imaging exposure. The present invention is adaptable to any application where high quality filter elements are needed.

In one preferred embodiment of the process of the present invention, there is provided a method of producing a planar array of filter elements comprising at least two sets of filter elements in an interlaid pattern. The method comprises the steps of:

() forming a layer, preferably, having a thickness less than 10 microns comprising a transparent binder, at least two cationic photo-bleachable dyes which selectively absorb radiation in different portions of the spectrum, and a sensitizer (each of said dyes is present in the layer in an amount sufficient to impart a density to the layer of about 0.5 in that portion of the spectrum in which it selectively absorbs);

(2) exposing said layer to a pattern representing a set of filter elements so as to photo-bleach one of said photo-bleachable dyes;

(3) exposing said layer to a pattern representing another set of filter elements so as to photo-bleach another of said photo-bleachable dyes; and (4) fixing said layer by leaching said sensitizer from said layer.

In preferred embodiments, the layer is formed in step (1) directly on the surface of a planar array of photosensors. This method directly forms a color imaging device comprising a planar array of photosensors and, in micro-registration therewith, the described planar array of filter elements. In this embodiment, micro-registration is accomplished by carefully positioning the exposures in steps (2) and (3). Also in preferred embodiments, the exposure steps (2) and (3) are carried out simultaneously by exposing the layer to a single pattern having both sets of filter elements.

A color filter array using only two dyes is useful in combination with an array of photosensors to provide a solid-state color imaging device. For example, in such an array, the layer would contain only cyan and yellow dyes so that the unexposed layer would transmit green light. The filter elements covering those sensor elements allocated to blue information are created by bleaching out the yellow dye, leaving cyan-colored elements. Similarly, the cyan dye is bleached out of the areas over the red sensors, leaving yellow elements. For the filter elements allocated to the green sensors, both the cyan and yellow remain in the layer. Color correction matrixing can be used to correct the signal for a standard red, green and blue display. One skilled in the art will readily appreciate uses for other similar embodiments.

In a particularly preferred embodiment of the present invention, the color imaging device is provided with an array comprising three sets of elements, each transmitting a different primary color. Thus, there is provided a method of producing a planar array of filter elements comprising three sets of filter elements in an interlaid pattern, a first set having elements containing yellow and magenta dyes, a second set having yellow and cyan dyes, and a third set having magenta and cyan dyes. The method comprises the steps of:

(1) forming a layer, preferably, having a thickness less than 10 microns comprising a transparent binder, cyan, magenta and yellow dyes, and a sensitizer wherein:
  (a) each of the dyes is a cationic photo-bleachable dye and wherein:
  (b) each of the cyan, magenta and yellow dyes, preferably, is present in the layer in an amount sufficient to impart a density to said layer of about 0.5 in the red, green and blue portion of the spectrum, respectively;

(2) exposing the layer to a pattern representing the first set of filter elements so as to selectively photo-bleach said cyan dye;

(3) exposing the layer to a pattern representing the second set of filter elements so as to selectively photo-bleach said magenta dye;

($\alpha$) exposing the layer to a pattern representing the third set of filter elements so as to selectively photo-bleach the yellow dye; and (5) fixing the layer by leaching the sensitizer from the layer. It is preferred that the layer be formed directly on the surface of the photosensor array and that the exposing steps (i.e., steps (2), (3) and (4) above) be carried out simultaneously.

The layer of the transparent binder containing the photo-bleachable dye or dyes and the sensitizer can be provided directly on the surface of a photosensor array or on a separate support. A mixture of the photo-bleachable dyes with the sensitizer is dissolved in any suitable solvent, e.g., acetone, methoxyethanol, ethoxyethanol, methanol, water and the like. In general, any solvent can be used that will dissolve the dyes, the sensitizer and the transparent binder. The dye-sensitizer solution is then admixed with the dissolved transparent binder or, alternatively, the transparent binder can be added to the dye-sensitizer solution.

The resulting coating composition can be coated by any of the well-known coating techniques, e.g., spin coating, doctor blade coating, hopper coating, flow coating and the like. The resulting layer should be less than 10 microns in thickness. The thickness can be determined by adjusting the coverage during coating or by direct measurement after coating. The thickness referred to is the thickness of the dry layer after fixing (fixing slightly reduces the thickness of the layer due to the removal of the sensitizer). Layers as thin as 0.5 micron having the desired density are possible using preferred dyes.

In forming the transparent binder layer on a semiconductive wafer, such as a semiconductive photosensor array, it has been found desirable to passivate the semiconductive surface by applying a layer of silicon dioxide prior to coating the transparent binder layer. It may also be desirable to apply a layer of subbing prior to coating the layer. Both the passivating layer and the subbing layer promote the adhesion of the transparent binder to the silicon wafer. A suitable subbing layer is described in U.S. Pat. No. 3,271,345.

After the transparent binder layer containing the photo-bleachable dye and sensitizer have been coated and dried, the array of color filters can be formed by simply exposing the layer to suitable patterns of the appropriate radiation. Generally, it is desirable to form all of the sets of filter elements using a single exposure. This can be done using contact printing techniques with a previously formed color filter array original. Alternatively, the original, which is larger than the final filter array, can be projection-printed using microreduction techniques. When contact printing is used, the color filter array original can be formed by the method according to the present invention using separate exposures through black-and-white masks, or by other suitable methods, such as those described in commonly assigned copending U.S. Application Ser. Nos. 730,885 and 730,886, cited above, both filed Oct. 8, 1976.

After the color filter array has been formed in the transparent binder layer, the color filter array can be fixed by leaching the sensitizer out of the layer. By fixed, it is meant that the layer is made insensitive to further exposure so that the density of the individual filter elements in the array remains substantially constant when the array is subsequently exposed to light. The sensitizer can be leached from the layer by simply contacting the layer with a suitable solvent. The solvent chosen should be able to permeate the layer, but should not dissolve the transparent binder material. Further, the solvent should be chosen so as to dissolve the sensitizer more rapidly than the dye. The particular solvent will, therefore, depend upon the particular transparent binder, the particular dyes and the particular sensitizer. Water is a particularly useful solvent. In another method of leaching the sensitizer from the layer, the sensitizer can be reacted with a compound which causes the sensitizer to come to the surface of the layer. For example, allylthiourea can be reacted with sulfurous acid, as described in U.S. Pat. No. 1,850,162. In still another method, the color filter array can be heated to a temperature sufficient to vaporize the sensitizer, but not so high as to decompose or otherwise adversely affect the other components of the filter array. After the layer has been fixed, conventional photoresist processes can be used to remove portions of the layer, such as from the bonding pads or scribe lines of a solid-state device.

The improved solid-state color imaging devices of the present invention can have a wide variety of forms. Variations can be made in the statistical relationship of the color filter elements; the relationship between the number of sensing areas and the number of filter elements; the degree of overlap of the filter elements and the guard band—to mention but a few. These variations are well known in the art. Similarly, the environment in which the solid-state color imaging device described herein is useful is also well known in the art and need not be discussed in detail. If a more detailed description is desired, reference is made to U.S. Pat. Nos. 3,971,065; 3,982,274; 4,054,906; 4,054,915 and the references cited therein.

The following examples are provided to further illustrate the invention.

EXAMPLE 1

A coating composition can be made in the following manner. Sixty grams of cellulose acetate hydrogenphthalate and 24 grams of N-allyl-N'-(β-hydroxyethyl) thiourea are dissolved in a mixture of 200 ml 2-ethoxyethanol and 200 ml 2-methoxyethyl acetate. The resulting solution is filtered through a 0.5μ filter. To 10 ml of this solution is added 120 mg of dye I*, 150 mg of dye II and 225 mg of dye III*. The dye solution is filtered through a 0.5μ filter.

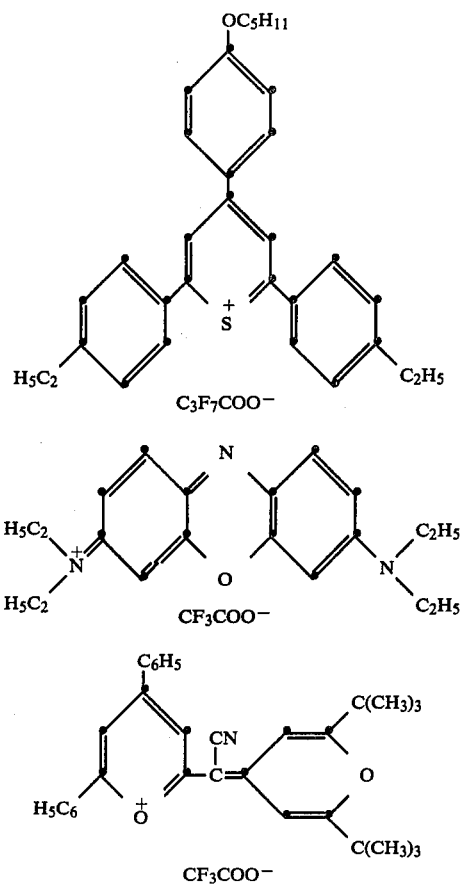

A color filter array can be made on an array of photosensors by carrying out the following steps:

(1) The silicon wafer containing the array of photosensors is rinsed with 1,1,1,3,3,3-hexamethyldisilazane and dried;

(2) The above-described coating composition is spin coated on the wafer at 600 rpm to produce a layer having a thickness of about 3 microns. A 3-micron layer from this coating composition will have a transmission density of at least 1.0 throughout the visible spectrum. At wavelengths of maximum absorption, the density will be 1.5 or greater;

(3) The wafer is baked at 100° C. for 10 minutes so as to remove all solvents;

(4) The wafer is exposed for 1 hour to the light of a 500-watt tungsten iodide lamp at a distance of 22 inches through a mask representing the desired array of green filter elements and through a green filter (Corning CS4-96 and CS3-69);

(5) Step (4) is repeated, except that the blue mask and a blue filter is used (2 Corning CS5-59);

(6) Step (4) is repeated, except that the red mask and red filter is used (Corning CS2-58);

(7) The wafer with the filter layer is submersed in water at 15° C. for 2 minutes to leach the N-allyl-N'-(β-hydroxyethyl) thiourea and fix the filter array.

A solid-state color imaging device having a high quality, stable color filter array will result from these steps.

EXAMPLE 2

A coating composition was made in the following manner: 20 g of cellulose acetate hydrogenphthalate and 8 g of N-allyl-N'-(β-hydroxyethyl) thiourea were dissolved in a mixture of 200 ml of 2-ethoxyethanol and 200 ml of 2-methoxyethyl acetate. The solution was filtered through a 0.5-micron filter. To 10 ml of this solution was added 30 mg of the yellow dye of Example 1 and 20 mg of the heptafluorobutyrate analog of dye II of Example 1. The solution was coated on a poly(ethylene terephthalate) film using a 6-mil doctor blade and dried for 2 hours at 60° F. The dried coating had a thickness of about 8 microns, a density of at leaast 1.0 throughout the blue portion of the spectrum, and a density of at least 1.5 throughout the red portion of the spectrum. Since there was no magenta dye in the coating, the coating appeared green.

Selected areas of the described coating were photobleached in the following manner. Certain areas were exposed to the light of a 500-watt tungsten iodide lamp using either a blue filter as in Example 1, or a red filter as in Example 1. The visual appearance of the film became cyan in those areas exposed using the blue filter and the appearance was yellow in those areas exposed using the red filter. The film was then submersed in water for 2 minutes to leach out the thiourea sensitizer. The resolution of the resulting filter patterns was limited only by the optics of exposure system.

EXAMPLE 3

A coating was made as in Example 2, except that 3 dyes were used. 20 mg of the trifluoroacetate analog of dye I of Example 1, 30 mg of dye II of Example 1 and 30 mg of dye III of Example 1 were added to the 10 ml of the cellulose acetatethiourea solution. One drop of butane sulfonic acid was added to the coating composition to insure the acidic conditions necessary for dye III. A filter layer was prepared as in Example 1 having a thickness of about 8 microns. The layer had a density of at least about 1.2 throughout the visible spectrum. Exposure as described in Example 1, steps (4), (5) and (6) resulted in a multicolor filter array having red, green and blue filter elements. The filter array was fixed as described in Example 2. Good resolution was obtained.

The invention has been described in detail with particular reference to preferred embodiments thereof, but it will be understood that variations and modifications can be effected within the spirit and scope of the invention.

I claim:

1. A method of producing a planar array of filter elements comprising the steps of:
   (1) forming a layer having a thickness less than 10 microns comprising a transparent binder, a cationic photo-bleachable dye which selectively absorbs radiation in at least one portion of the spectrum, and a sensitizer said dye being present in said layer in an amount sufficient to impart a density to said layer of about 0.5 in that portion of the spectrum in which it selectively absorbs;

(2) exposing said layer to a pattern representing said filter elements so as to photo-bleach said photo-bleachable dye;

(3) fixing said layer by leaching said sensitizer from said layer.

2. A method of producing a planar array of filter elements comprising at least two sets of filter elements in an interlaid pattern, said method comprising the steps of:

(1) forming a layer having a thickness less than 10 microns comprising a transparent binder and at least two cationic photo-bleachable dyes which selectively absorb radiation in different portions of the spectrum and a sensitizer, each of said dyes being present in said layer in an amount sufficient to impart a density to said layer of about 0.5 in that portion of the spectrum in which it selectively absorbs;

(2) exposing said layer to a pattern representing a set of filter elements so as to photo-bleach one of said photo-bleachable dyes;

(3) exposing said layer to a pattern representing another set of filter elements so as to photo-bleach another of said photo-bleachable dyes; and (4) fixing said layer by leaching said sensitizer from said layer.

3. A method of producing a planar array of filter elements according to claim 2 wherein said exposure steps (2) and (3) are performed simultaneously.

4. A method of producing a planar array of filter elements according to claim 2 wherein said layer has a thickness of less than 3 microns and wherein said dyes are present in an amount sufficient to impart a density of at least about 1.5.

5. A method of producing a planar array of filter elements according to claim 2 wherein said layer comprises at least two photo-bleachable dyes, wherein one of said dyes absorbs radiation in a first portion of the spectrum and another of said dyes absorbs radiation in a section portion of the spectrum corresponding to a shorter wavelength than that to which said first portion corresponds, and wherein said second dye has a higher bleaching efficiency than said first dye.

6. A method of producing a planar array of filter elements according to claim 2 wherein said photo-bleachable dyes are selected from the group consisting of chromylium and thiachromylium dyes; pyrylium and thiapyrylium cyanines; and flavylium and thiaflavylium cyanines.

7. A method of producing a planar array of filter elements comprising three sets of filter elements in an interlaid pattern, a first set having elements containing yellow and magenta dyes, a second set having yellow and cyan dyes, and a third set having magenta and cyan dyes, said method comprising the steps of:

(1) forming a layer having a thickness less than 10 microns comprising a transparent binder and a cyan, a magenta and a yellow dye and a sensitizer wherein:

(a) each of said dyes is a cationic photo-bleachable dye, and wherein:

(b) each of said cyan, magenta and yellow dyes is present, in said layer, in an amount sufficient to impart a density to said layer of about 0.5 in the red, green and blue portion of the spectrum, respectively, and wherein:

(c) the bleaching efficiency of said yellow dye and of said magenta dye is greater than the bleaching efficiency of said cyan dye;

(2) exposing said layer to a pattern representing said first set of filter elements so as to selectively photo-bleach said cyan dye;

(3) exposing the layer to a pattern representing said second set of filter elements so as to selectively photo-bleach said magenta dye;

(4) exposing said layer to a pattern representing said third set of filter elements so as to selectively photo-bleach said yellow dye; and (5) fixing said layer by leaching said sensitizer from said layer.

8. A method of producing a planar array of filter elements according to claim 7 wherein said exposure steps (2), (3) and (4) are performed simultaneously.

9. A method of producing a planar array of filter elements according to claim 7 wherein said layer has a thickness less than about 3 microns and wherein said dyes are present in an amount sufficient to impart a density of at least about 1.5.

10. A method of producing a planar array of filter elements according to claim 7 wherein said photo-bleachable dyes are selected from the group consisting of chromylium and thiachromylium dyes; pyrylium and thiapyrylium cyanines; and flavylium and thiaflavylium cyanines.

11. A method of producing a color imaging device comprising:

(i) a planar array of charge-handling semiconductive photosensors and superimposed in micro-registration therewith, (ii) a single layer of a transparent binder containing a planar array of filter elements comprising at least two sets of filter elements in an interlaid pattern, said method comprising the steps of:

(1) producing a planar array of filter elements by a method comprising the steps of:

(a) forming a layer having a thickness less than 10 microns comprising a transparent binder, at least two cationic photo-bleachable dyes which selectively absorb radiation in different portions of the spectrum, and a sensitizer, each of said dyes being present in said layer in an amount sufficient to impart a density to said layer of about 0.5 in that portion of the spectrum in which it absorbs;

(b) exposing said layer to a pattern representing a set of filter elements so as to photo-bleach one of said photo-bleachable dyes;

(c) exposing said layer to a pattern representing another set of filter elements so as to photo-bleach another of said photo-bleachable dyes; and (d) fixing said layer by leaching said sensitizer from said layer; and (2) superimposing said planar array of filter elements in micro-registration with said planar array of charge-handling semiconductive photosensors.

12. A method of producing a color imaging device according to claim 11 wherein said layer is formed on the surface of said planar array of photosensors, and wherein said micro-registration step is accomplished during exposing steps (b) and (c).

13. A method of producing a color imaging device comprising:

(i) a planar array of charge-handling semiconductive photosensors and superimposed in micro-registration therewith, (ii) a single layer of a transparent binder containing a planar array of filter elements comprising three sets of filter elements lying in an interlaid pattern, a first set having elements containing yellow and magenta dyes, a second set having elements containing yellow and cyan dyes, and a third set having elements containing magenta and cyan dyes, said method comprising the steps of:

(1) producing said planar array of filter elements by a method comprising the steps of:

(a) forming a layer having a thickness less than 10 microns comprising a transparent binder and a cyan, a magenta and a yellow dye and a sensitizer wherein:

(I) each of said dyes is a cationic photo-bleachable dye and wherein:

(II) each of said cyan, magenta and yellow dyes is present in said layer in an amount sufficient to impart a density to said layer of about 0.5 in the red, green and blue portion of the spectrum, respectively, and wherein:

(III) the bleaching efficiency of said yellow dye and of said magenta dye is greater than the bleaching efficiency of said cyan dye;

(b) exposing said layer to a pattern representing said first set of filter elements so as to selectively photo-bleach said cyan dye;

(c) exposing said layer to a pattern representing said second set of filter elements so as to selectively photo-bleach said magenta dye;

(d) exposing said layer to a pattern representing said third set of filter elements so as to selectively photo-bleach said yellow dye; and (e) fixing said layer by leaching said sensitizer from said layer; and (2) superimposing said planar array of filter elements in micro-registration with said planar array of photosensors.

14. A method of producing a color imaging device according to claim 13 wherein said exposing steps (b), (c) and (d) are performed simultaneously.

15. A method of producing a color imaging device according to claim 13 wherein said transparent binder layer is formed on the surface of said planar array of photosensors and wherein said micro-registration step is accomplished during said exposure steps (b), (c) and (d).

16. A method of producing a color imaging device according to claim 13 wherein said photo-bleachable dyes are selected from the group consisting of chromylium and thiachromylium dyes; pyrylium and thiapyrylium cyanines; and flavylium and thiaflavylium cyanines.

17. A method of producing a color imaging device according to claim 13 wherein said sensitizer is a compound that contains a group selected from thiocarbonyl, mercapto, carbonyl peroxide and thioether.

18. A method of producing a color imaging device according to claim 11 wherein said sensitizer is N-allyl-N'-(β-hydroxyethyl) thiourea.

* * * * *

UNITED STATES PATENT AND TRADEMARK OFFICE
CERTIFICATE OF CORRECTION

PATENT NO. : 4,345,011
DATED : August 17, 1982
INVENTOR(S) : Karl H. Drexhage

It is certified that error appears in the above-identified patent and that said Letters Patent are hereby corrected as shown below:

On the title page of the patent under the Section, Attorney, Agent, or Firm change "James R. Everett" to read --John R. Everett--.

Signed and Sealed this

Third Day of May 1983

[SEAL]

Attest:

GERALD J. MOSSINGHOFF

Attesting Officer

Commissioner of Patents and Trademarks